United States Patent
Cardwell

(10) Patent No.: US 8,865,587 B2
(45) Date of Patent: Oct. 21, 2014

(54) MULTI-CHIP-SCALE PACKAGE

(71) Applicant: International Rectifier Corporation, El Segundo, CA (US)

(72) Inventor: Stuart Cardwell, East Sussex (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/956,620

(22) Filed: Aug. 1, 2013

(65) Prior Publication Data

US 2013/0316527 A1 Nov. 28, 2013

Related U.S. Application Data

(62) Division of application No. 12/799,530, filed on Apr. 27, 2010, now Pat. No. 8,525,334.

(51) Int. Cl.
| | |
|---|---|
| H01L 21/4763 | (2006.01) |
| H01L 25/18 | (2006.01) |
| H01L 21/768 | (2006.01) |
| H01L 23/495 | (2006.01) |
| H01L 23/00 | (2006.01) |

(52) U.S. Cl.
CPC . *H01L 21/76879* (2013.01); *H01L 2924/13055* (2013.01); *H01L 2224/48137* (2013.01); *H01L 25/18* (2013.01); *H01L 2924/15747* (2013.01); *H01L 2224/49111* (2013.01); *H01L 24/48* (2013.01); *H01L 2224/48247* (2013.01); *H01L 23/49575* (2013.01)

USPC .......... 438/618; 257/736; 257/737; 257/738; 257/777; 257/778; 257/781; 257/782; 438/106; 438/737; 438/125; 438/109

(58) Field of Classification Search
USPC ......... 257/517, 723–725, 736–738, 777–778, 257/781–782; 438/106, 737, 125, 109, 618
See application file for complete search history.

(56) References Cited

U.S. PATENT DOCUMENTS

| | | | | |
|---|---|---|---|---|
| 7,361,533 | B1 * | 4/2008 | Huemoeller et al. | 438/123 |
| 7,808,101 | B2 * | 10/2010 | Liu et al. | 257/723 |
| 7,960,211 | B2 * | 6/2011 | Galera et al. | 438/107 |
| 2003/0122244 | A1 * | 7/2003 | Lin et al. | 257/700 |
| 2005/0285235 | A1 * | 12/2005 | Carney et al. | 257/666 |

* cited by examiner

*Primary Examiner* — Fernando L Toledo
*Assistant Examiner* — Mohammed Shamsuzzaman
(74) *Attorney, Agent, or Firm* — Farjami & Farjami LLP

(57) ABSTRACT

Some exemplary embodiments of a multi-chip semiconductor package utilizing a semiconductor substrate and related method for making such a semiconductor package have been disclosed. One exemplary embodiment comprises a first semiconductor device including, on a surface thereof, a first patterned dielectric layer, a conductive redistribution layer, a second patterned dielectric layer, and a second semiconductor device. The conductive redistribution layer connects to a first and a second patterned conductive attach material for connecting the first and second semiconductor devices to provide coplanar electrical connections for mounting on a printed circuit board. In one embodiment, the first semiconductor device is a diode having anode and cathode contacts on an upper surface thereof, and the second semiconductor device is an IGBT.

18 Claims, 4 Drawing Sheets

MULTI-CHIP-SCALE PACKAGE

This is a divisional of application Ser. No. 12/799,530 filed Apr. 27, 2010.

BACKGROUND OF THE INVENTION

1. Field of the Invention

The present invention relates generally to semiconductor devices. More particularly, the present invention relates to packaging for semiconductor devices.

2. Background Art

Packages combining several semiconductor components into a single package can help simplify circuit design, reduce costs, and provide greater efficiency and improved performance by keeping related and dependent circuit components in close proximity. These integrated multi-chip device packages facilitate application integration and greater performance compared to using discrete components. In particular, it is often desirable to package power devices such as IGBTs with diodes for various purposes such as circuit protection or reverse current handling.

Previously, package designs using side-by-side co-packed components have been used. However, due to the space required to co-pack each circuit component, a very large substrate is often necessary to support the package, increasing the overall package form factor. This large form factor reduces integration flexibility for space-optimized application designs. Furthermore, to implement a cost effective package, low-cost materials such as ceramics are often preferable for the substrate. Unfortunately, due to mismatched thermal expansion coefficients between ceramic substrates and attached materials such as silicon, co-pack designs using ceramic substrates are subject to heat related stresses during operation. Over time, these heat-related stresses cause solder fatigue and may eventually cause breakage and other defects, reducing long-term reliability.

Thus, a unique cost-effective, compact, and reliable solution is needed to support the efficient operation of multi-chip packages.

SUMMARY OF THE INVENTION

A semiconductor on semiconductor substrate multi-chip-scale package, substantially as shown in and/or described in connection with at least one of the figures, as set forth more completely in the claims.

DETAILED DESCRIPTION OF THE INVENTION

The present application is directed to a semiconductor on semiconductor substrate multi-chip-scale package. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1:
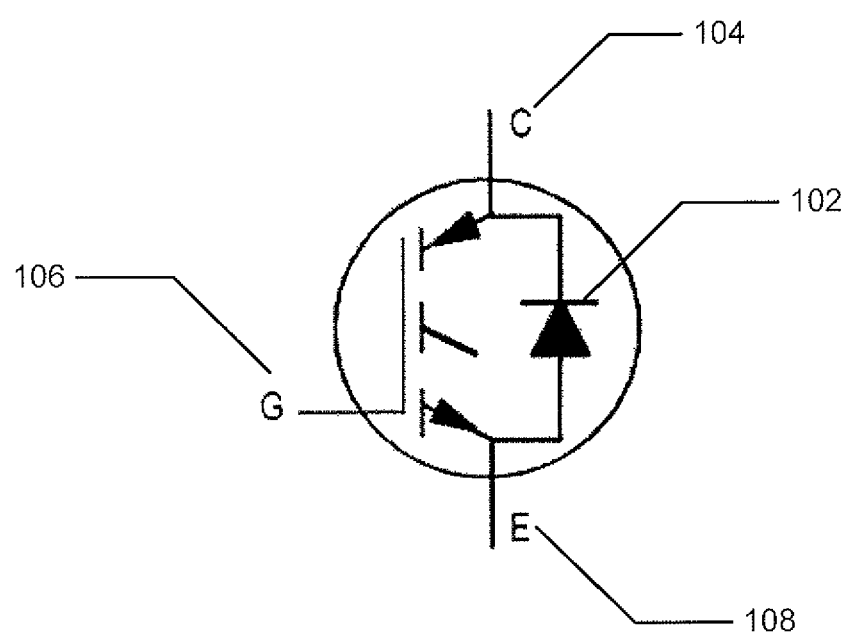
FIG. 1 illustrates a schematic diagram of an IGBT with a parallel diode.

FIG. 1 illustrates a schematic diagram of an IGBT with a parallel diode. Collector 104, gate 106, and emitter 108 of the IGBT are indicated in FIG. 1, with diode 102 connected in parallel. As shown by the orientation of diode 102, emitter 108 is connected to the anode side of diode 102 whereas collector 104 is connected to the cathode side of diode 102. This parallel diode circuit design may provide desirable features such as high reverse current handling for the IGBT.

Figure 2:
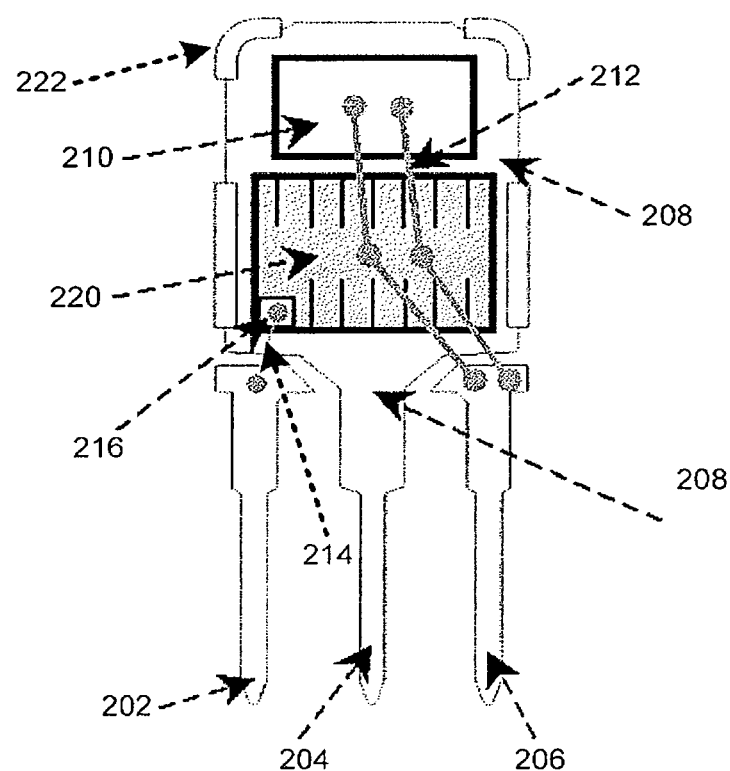
FIG. 2 illustrates a design of a conventional semiconductor package co-packing an IGBT with a parallel diode.

FIG. 2 illustrates a design of a conventional semiconductor package co-packing an IGBT with a parallel diode. The top of diode 210, shown anode side facing up, is connected to the top of IGBT 220, shown emitter side facing up, via wirebonds 212. This connection corresponds to emitter 108 connecting to the anode side of diode 102 in FIG. 1. Wirebonds 212 also connect the emitter of IGBT 220 to leg contact 206 for external circuit connection. Copper leadframe 208, which may be disposed on a ceramic substrate, provides a connection between the bottom of diode 210, or the cathode side, and the bottom of IGBT 220, or the collector side. This connection corresponds to collector 104 connecting to the cathode side of diode 102 in FIG. 1. Copper leadframe 208 also extends down to connect to leg contact 204 for external circuit connection. Finally, wirebond 214 connects gate 216 of IGBT 220 with leg contact 202 for external circuit connection, corresponding to gate 106 of FIG. 1. After being surrounded by mold 222, a completed package implementing the circuit diagram of FIG. 1 is thus ready to be integrated onto a PCB or other mounting target via leg contacts 202, 204, and 206.

While the conventional co-pack design shown in FIG. 2 implements the circuit of FIG. 1, several drawbacks still exist. As shown in FIG. 2, the connections for the upper side of the circuits are via wirebonds 212 and 214, which is much less effective for electrical and thermal conduction compared to direct solder attachment. Furthermore, since diode 210 and IGBT 220 are placed side-by-side, a large area substrate is required, creating a large and unwieldy package form factor. For a cost effective package, a ceramic substrate is preferable, but due to thermal expansion coefficient mismatches, the package will be subject to mechanical stresses during thermal cycling occurring within normal operation, reducing package reliability and longevity.

FIGS. 3A-3H illustrate a fabrication of a semiconductor package according to an embodiment of the invention. In the example illustrated by FIGS. 3A-3H, diode 310 is used as a substrate for mounting an IGBT 360. However, alternative embodiments may use different semiconductor devices or integrate more than two semiconductor devices, as required by the desired circuit design.

Figure 3A:
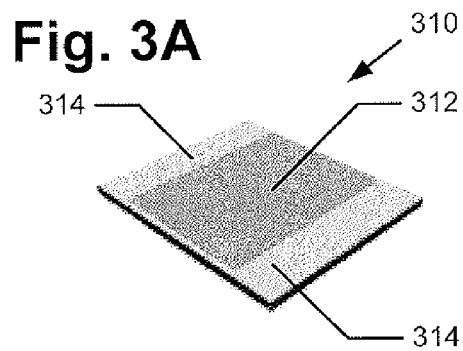
FIGS. 3A-3H illustrate fabrication of a semiconductor package according to an embodiment of the invention.

In a conventional diode, the anode and cathode contacts may each occupy substantially the entire opposite major surfaces of the diode. However, diode 310 in FIG. 3A is designed to have a contact for anode 312 in the center of the upper surface of diode 310 and a contact for cathode 314 around an extended perimeter of anode 312 and extending to the lower surface of diode 310. Thus, contacts for both anode 312 and cathode 314 are readily available from the upper surface of diode 310, and a contact for cathode 314 is available from the lower surface of diode 310.

Figure 3B:
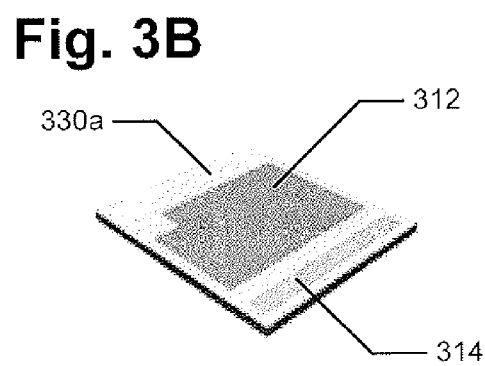

Turning to FIG. 3B, a first dielectric layer 330a is patterned on top of diode 310, with openings exposing contacts for anode 312 and cathode 314. As shown in FIG. 3B, cathode 314 is exposed as a rectangular contact to the right, whereas anode 312 is exposed as a large rectangular contact with a portion of the lower left corner removed. The rest of the top of diode 310 is covered and insulated by dielectric layer 330a.

Figure 3C:
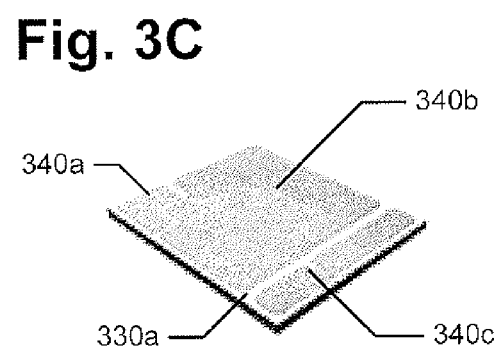

Addressing FIG. 3C, a conductive redistribution layer is patterned on top of diode 310, covering and extending through dielectric layer 330a to make contact with the exposed contacts of FIG. 3B. As shown in FIG. 3C, the conductive redistribution layer is formed with openings to create three distinct regions, or conductive redistribution regions 340a, 340b, and 340c, which may comprise conductive materials such as copper. Dielectric layer 330a can be seen remaining within the openings between the regions. The shape of the regions may be defined in any desired manner to support particular electrical routing requirements. In the case of FIG. 3C, conductive redistribution region 340a eventually routes the gate contact of IGBT 360 to the lower-left contact of the final package, conductive redistribution region 340b eventually routes the collector contact of IGBT 360 to the upper-left two contacts of the final package, and conductive redistribution region 340c simply passes the cathode contact of diode 310 directly upwards.

Figure 3D:
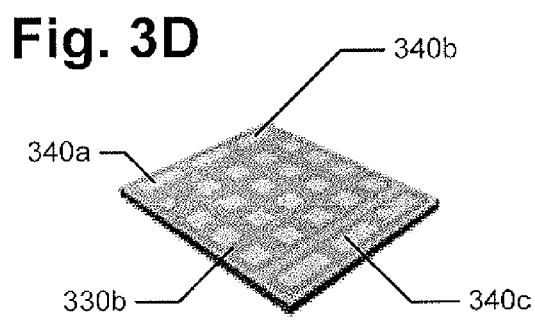

With respect to FIG. 3D, a second dielectric layer 330b is patterned on top of diode 310 with a grid of openings defining pad connections for the conductive redistribution regions below. Additionally, dielectric layer 330b extends through the conductive redistribution layer to contact the exposed dielectric layer 330a below in FIG. 3C, thereby electrically insulating conductive redistribution regions 340a-340c. In this manner, a grid of pads is exposed at the top, facilitating integration with external components by encouraging self-aligning solder joints.

Figure 3E:
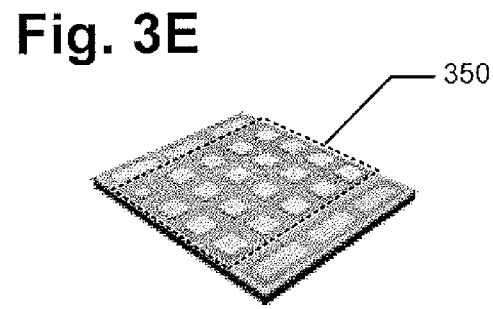

Discussing FIG. 3E, a first conductive attach material layer 350 (also referred to as a "patterned conductive attach material" in the present application) is applied to the central array of four by five pads indicated by the dotted region. Conductive attach material layer 350 may comprise, for example, solder balls or bumps, a solder pre-form, or another means of conductive attachment. After conductive attach material layer 350 is applied, diode 310, or the first semiconductor device, is now ready to receive a second semiconductor device, or IGBT 360.

Figure 3F:
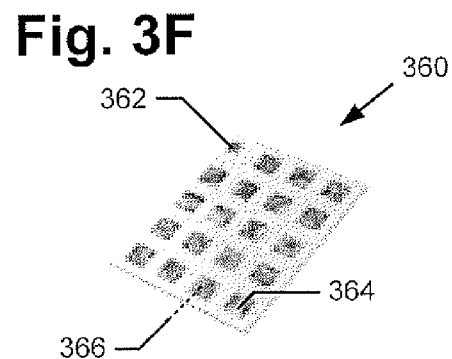

Turning to FIG. 3F, an upper side of IGBT 360 is shown, with a pad for gate 362 located to the upper-right. Although only one pad for emitter 364 is indicated, it should be understood that the remaining pads on the upper side are all pad contacts for emitter 364. Collector 366 is indicated on the lower side of IGBT 360, comprising a four by five grid of pads. Since the pad surfaces of FIG. 3E have been prepared with conductive attach material layer 350, IGBT 360 is now ready for flip-chip mounting on diode 310.

Figure 3G:
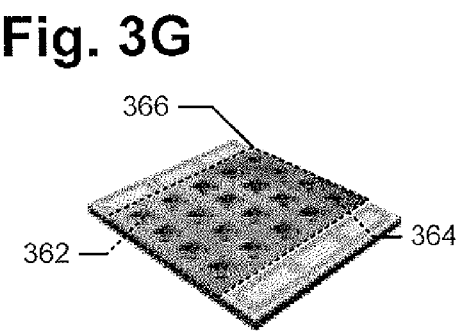

In FIG. 3G, it can be seen that IGBT 360 has been flip-chipped onto the surface of diode 310. As a result of the flipping, the four by five grid of pads for collector 366 is now visible on top, as indicated by the dotted region. The pad for gate 362 and one of the pads for emitter 364 are as indicated on the bottom surface of IGBT 360, being in direct contact with conductive attach material layer 350. At this point, a solder reflow or another binding process may have already taken place to firmly secure IGBT 360 onto diode 310, creating a single unified package.

Figure 3H:
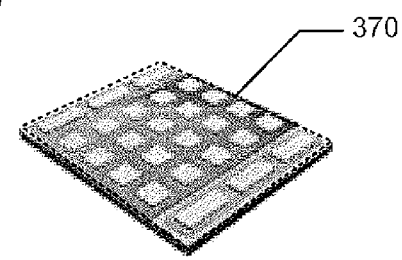

Turning to FIG. 3H, a second conductive attach material layer 370 (also referred to as a "patterned conductive attach material" in the present application) is applied to the all of the exposed pads on top of the package. However, since the middle four by five grid of pads are at a higher elevation than the outer perimeter pads due to IGBT 360, conductive attach material layer 370 may be conceptualized as separate distinct layers for each pad elevation. Thus, conductive attach material layer 370 may be split into an inner central layer starting at a higher elevation and an outer perimeter layer starting at a lower elevation. These two layers be formed such that their top ending heights are substantially coplanar, allowing the package to be readily flip-chipped onto a flat receiving surface such as a PCB. However, if alternative topologies are desired for non-planar device integration, certain layers may lack coplanar pad contacts and different layers may not necessarily be coplanar with each other. For the example shown in FIG. 3H, coplanar external connections are assumed, and thus all pads are covered with conductive attach material layers reaching the same height.

By following the fabrication steps shown in FIGS. 3A-3H, a semiconductor package can be created that efficiently utilizes a semiconductor device as a substrate for another semiconductor device in a compact form factor using existing well-known processes for cost effective fabrication. Cost savings are thus achieved since separate substrate materials can be omitted. By using thermally matched materials for the semiconductor devices, such as using all silicon, mechanical stability can be greatly enhanced as thermal expansion and contraction can occur at the same rate, mitigating the deleterious effects of thermal cycling. Moreover, by utilizing direct solder connections for short path connections between semiconductor devices and for board integration, higher thermal performance and conductivity can be achieved by avoiding the use of inefficient wirebonds. While only two semiconductor devices are used in the present example, alternative embodiments may include several semiconductor devices in a single package through careful design of a complex conductive redistribution layer.

Figure 4A:
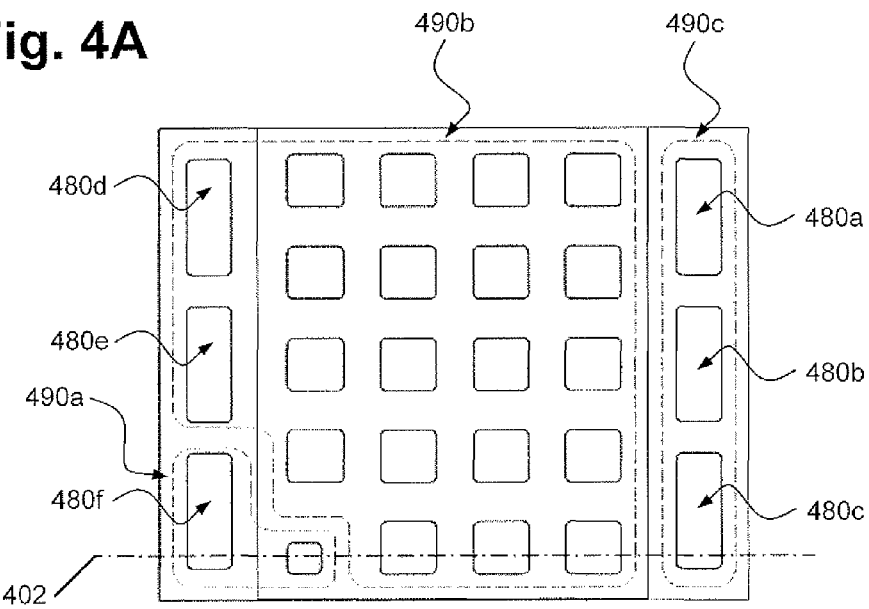
FIG. 4A illustrates a top-plan view of a semiconductor package according to an embodiment of the invention.

FIG. 4A illustrates a top-plan view of a semiconductor package according to an embodiment of the invention. Contacts 480a through 480f are shown on the top of the semiconductor package. Conductive redistribution regions 340a to 340c are shown again by dotted regions 490a to 490c in FIG. 4A. Cross sectional line 402 indicates the cross sectional slice illustrated below in FIG. 4B.

Figure 4B:
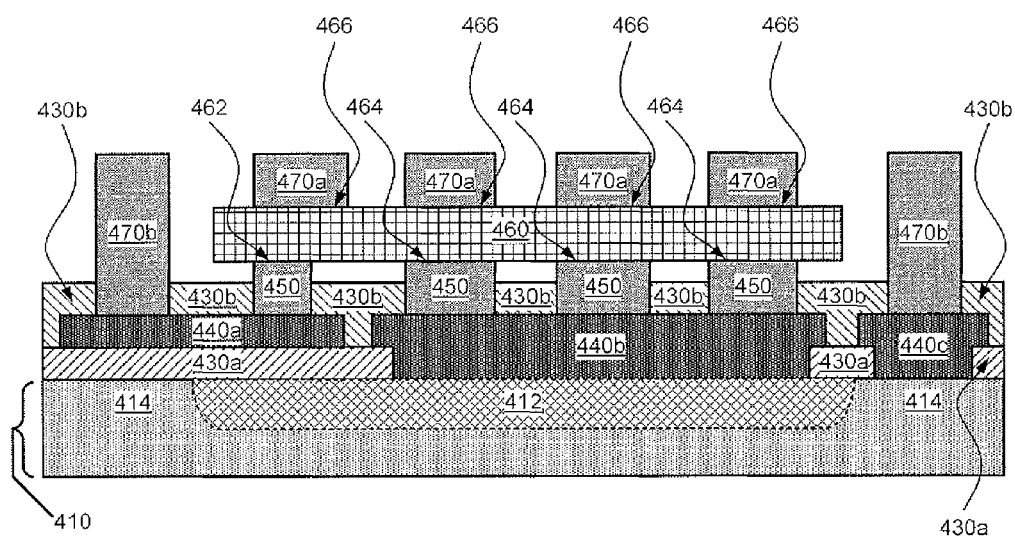
FIG. 4B illustrates a cross sectional view of a semiconductor package according to an embodiment of the invention.

FIG. 4B illustrates a cross sectional view of a semiconductor package according to an embodiment of the invention. The cross sectional view shown in FIG. 4B corresponds to cross sectional line 402 of FIG. 4A. Dielectric layers 430a and 430b correspond to dielectric layers 330a and 330b from FIGS. 3B and 3C, and conductive attach material layer 450 corresponds to conductive attach material layer 350 from FIG. 3E. Diode 410 is shown as the substrate receiving IGBT 460 for the package. Cathode 414 of diode 410 is connected straight through using conductive redistribution region 440c and conductive attach material layer 470b, providing cathode connections to contacts 480a, 480b, and 480c on top of the semiconductor package, as shown in FIG. 4A. Anode 412 of diode 410 is connected through conductive redistribution region 440b to connect to pads for collector 466 of IGBT 460. However, if cross sectional line 402 is moved further up the diagram in FIG. 4A, then conductive redistribution region 440b further extends towards the left edge to connect contacts 480d and 480e, as indicated by dotted region 490b FIG. 4A.

In this manner, the diode anode to IGBT collector connection represented by wirebonds 212 of FIG. 2 can be routed to contacts 480d and 480e of the package. This re-routing is needed since the center of the package is already occupied by the emitter 464 connections of IGBT 460, continuing through the collector 466 connections of IGBT 460 and conductive attach material layer 470a. Similarly, a connection for gate 462 of IGBT 460 is brought across to the left using conductive redistribution region 440a connected to conductive attach material layer 470b, providing a gate connection through contact 480f.

After the package of FIG. 4B is flip-chipped or otherwise integrated onto a PCB or another target platform, traces on the PCB or another means of connection can then be made to connect emitter 466 with cathode 414, thus providing the diode cathode to IGBT emitter connection represented by copper leadframe 208 of FIG. 2. Therefore, it can be seen that the structure of FIG. 4B provides the same functionality as the co-pack structure of FIG. 2, but in a more efficient, compact, and reliable manner as discussed above.

Thus, a semiconductor package using a semiconductor device as a substrate and related method for making such a semiconductor package have been described. The invention's innovative package allows for a compact form factor, improved electrical and thermal conductivity, enhanced mechanical stability, and cost effective fabrication compared to conventional co-packages. These benefits may be of particular interest for packages integrating power devices such as IGBTs with diodes, as discussed in the present examples.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A method of fabricating a semiconductor package, said method comprising:
    forming on a first semiconductor device, a first patterned dielectric layer, a conductive redistribution layer in electrical contact with said first semiconductor device, and a second patterned dielectric layer;
    forming a first patterned conductive attach material selectively coupled to said conductive redistribution layer;
    placing a second semiconductor device in electrical contact with said first patterned conductive attach material; and
    forming a second patterned conductive attach material over said second semiconductor device, a first layer of said second patterned conductive attach material selectively coupled to said conductive redistribution layer, a second layer of said second patterned conductive attach material selectively coupled to said second semiconductor device;
    said first layer of said second patterned conductive attach material being substantially coplanar with said second layer of said second patterned conductive attach material so as to be together mechanically and electrically connectable to a printed circuit board.

2. The method of claim 1, wherein said conductive redistribution layer comprises copper.

3. The method of claim 1, wherein said first semiconductor device is a diode.

4. The method of claim 3, wherein said diode includes an anode contact disposed on an upper surface of said diode and a cathode contact disposed around a perimeter of said anode contact.

5. The method of claim 1, wherein said second semiconductor device is an IGBT.

6. The method of claim 5, wherein said IGBT includes a gate contact and an emitter contact on a lower surface of said IGBT and a collector contact on an upper surface of said IGBT.

7. The method of claim 1, wherein said first semiconductor device is a diode and said second semiconductor device is an IGBT.

8. A method comprising:
    forming on a first semiconductor device, a first patterned dielectric layer, a conductive redistribution layer, and a second patterned dielectric layer;
    forming a first patterned conductive attach material selectively coupled to said conductive redistribution layer;
    placing a second semiconductor device in electrical contact with said first patterned conductive attach material;
    forming a second patterned conductive attach material over second semiconductor device, a first layer of said second patterned conductive attach material selectively coupled to said conductive redistribution layer, a second layer of said second patterned conductive attach material selectively coupled to said second semiconductor device;
    said first and second layers of said second patterned conductive attach material being connectable to a printed circuit board.

9. The method of claim 8, wherein said conductive redistribution layer comprises copper.

10. The method of claim 8, wherein said first semiconductor device is a diode.

11. The method of claim 8, wherein said diode includes an anode contact disposed on an upper surface of said diode and a cathode contact disposed around a perimeter of said anode contact.

12. The method of claim 8, wherein said second semiconductor device is an IGBT.

13. The method of claim 8, wherein said IGBT includes a gate contact and an emitter contact on a lower surface of said IGBT and a collector contact on an upper surface of said IGBT.

14. The method of claim 8, wherein said first semiconductor device is a diode and said second semiconductor device is an IGBT.

15. A method comprising:
    forming on a diode, a first patterned dielectric layer, a conductive redistribution layer, and a second patterned dielectric layer;
    forming a first patterned conductive attach material selectively coupled to said conductive redistribution layer;
    placing an IGBT in electrical contact with said first patterned conductive attach material;
    forming a second patterned conductive attach material over said IGBT, a first layer of said second patterned conductive attach material selectively coupled to said conductive redistribution layer, a second layer of said second patterned conductive attach material selectively coupled to said IGBT;

said first and second layers of said second patterned conductive attach material being connectable to a printed circuit board.

16. The method of claim 15, wherein said conductive redistribution layer comprises copper.

17. The method of claim 15, wherein said diode includes an anode contact disposed on an upper surface of said diode and a cathode contact disposed around a perimeter of said anode contact.

18. The method of claim 15, wherein said IGBT includes a gate contact and an emitter contact on a lower surface of said IGBT and a collector contact on an upper surface of said IGBT.

* * * * *